United States Patent [19]

Rau et al.

[11] Patent Number: 5,186,784
[45] Date of Patent: Feb. 16, 1993

[54] PROCESS FOR IMPROVED DOPING OF SEMICONDUCTOR CRYSTALS

[75] Inventors: Mann-Fu Rau; Faa-Ching M. Wang, both of Plano; Jimmy D. Kurz, Rockwall, all of Tex.

[73] Assignee: Texas Instruments Incorporated, Dallas, Tex.

[21] Appl. No.: 368,561

[22] Filed: Jun. 20, 1989

[51] Int. Cl.$^5$ .............................................. C30B 15/04
[52] U.S. Cl. .................... 156/605; 156/607; 156/617.1; 156/626.1; 156/DIG. 70
[58] Field of Search ............... 156/605, 607, 617.1, 156/618.1, 620.1, DIG. 70

[56] References Cited

U.S. PATENT DOCUMENTS

| 3,647,389 | 3/1972 | Weiner | 23/204 |
| 4,478,675 | 10/1984 | Akai | 156/605 |
| 4,528,061 | 7/1985 | Miyazawa et al. | 156/620.2 |
| 4,594,173 | 6/1986 | Hobgood et al. | 156/605 |
| 4,846,927 | 7/1989 | Takahashi | 156/618.1 |

FOREIGN PATENT DOCUMENTS

| 0149898 | 7/1985 | European Pat. Off. | 156/605 |
| 58-9895 | 1/1983 | Japan | 156/617.1 |
| 59-131593 | 7/1984 | Japan | 156/617.1 |
| 60-27695 | 2/1985 | Japan | 156/617.1 |
| 60-65794 | 4/1985 | Japan | 156/617.1 |
| 61-155296 | 7/1986 | Japan | 156/620.2 |
| 61-247693 | 11/1986 | Japan | 156/618.1 |
| 61-286298 | 12/1986 | Japan | 156/617.1 |
| 62-123095 | 6/1987 | Japan | 156/617.1 |
| 63-17289 | 1/1988 | Japan | 156/607 |
| 63-85100 | 4/1988 | Japan | 156/607 |
| 63-89497 | 4/1988 | Japan | 156/605 |
| 63-89498 | 4/1988 | Japan | 156/617.1 |
| 63-94618 | 4/1988 | Japan | 156/617.1 |
| 63-315599 | 12/1988 | Japan | 156/617.1 |
| 2189166 | 4/1986 | United Kingdom | 156/620.2 |

OTHER PUBLICATIONS

*Chemical Abstracts*, vol. 80, (1973), Abstract 88629x.
*Chemical Abstracts*, vol. 102, (1985), Abstract 103809z.
*Chemical Abstracts*, vol. 107, (1987), Abstract 166431u.
*Chemical Abstracts*, vol. 107, (1987), Abstract 226209q.
*Chemical Abstracts*, vol. 108, (1987), Abstract 196296s.
*Chemical Abstracts*, vol. 110, (1988), Abstract 16246k.
Kubota, et al, "LEC Growth of InP Single Crystals Using Ceramics AlN Crucible", (Abstract 85:236 Compendex).
Fujii, et al, "Effects of Crucible Material on Undoped LEC GaAs Crystals", (Abstract 88:325 Compendex).
Fujii, et al, "Effects of Crucible Material on Undoped LEC GaAs Crystals", (Abstract 88:3143 PHYS).
Fujii, et al, "Growth and Optical Device Evaluation of P-Type Conductive LEC GaAs Co-Doped with In and Zn", (Abstract 88:54665 PHYS).

Primary Examiner—Robert Kunemund
Attorney, Agent, or Firm—René E. Grossman; Jay M. Cantor; Richard L. Donaldson

[57] ABSTRACT

Doping of IIIB-VB semiconductor crystals grown by the liquid encapsulated Cyochralski techniques is improved by introducing a metal to the crucible. The metal is characterized as having a lower melting temperature and a lower free energy of oxide formation than the dopant element.

16 Claims, No Drawings

PROCESS FOR IMPROVED DOPING OF SEMICONDUCTOR CRYSTALS

BACKGROUND OF THE INVENTION

1. Field of the Invention

This invention relates to an improvement in the liquid encapsulated Czochralski crystal pulling technique of forming highly conductive semiconductor crystals.

2. Brief Description of the Prior Art

It is known that high dopant levels of IVB or VIB elements are difficult to achieve in a IIIB-VB semiconductor crystal grown by the liquid encapsulation Czochralski technique (LEC). As a result, carrier concentrations above $3 \times 10^{17}$ per cubic centimeter are not common. One reason for this problem is that the boric oxide used as the barrier or encapsulating liquid is highly hygroscopic and cannot be maintained absolutely moisture free. When used as an encapsulant for growing doped semiconductor crystals, the dopant acts as a gettering substance and hence some of the dopant forms an oxide rather than doping the semiconductor crystal as the crystal is grown. One method used to increase the amount of dopant in the melt, is to add a greater excess of the dopant. While this may increase the dopant concentration in the final crystal, it is difficult to achieve uniform concentrations within the crystal, and difficult to control exactly how much dopant will end up in the crystal.

Other techniques for increasing the dopant level include pre-drying the boric oxide with or without a gettering substance, and the use of magnetic fields. The prior art usually requires changes in equipment or additional processing steps to achieve the desired results.

SUMMARY OF THE INVENTION

In contrast to the above referred to techniques, it has now been discovered that by including a suitable metal in the crucible charge, the amount of dopant in the final semiconductor crystal can be increased. This discovery is significant in that little or no change in equipment is required to achieve the results as herein described.

This invention is particularly applicable to achieving high dopant concentrations in semiconductor crystals grown with the liquid encapsulated Czochralski technique. Accordingly, in one of its embodiments this invention provides an improvement in a process of preparing in a crucible a molten boric oxide encapsulate IIIB-VB semiconductor crystal doped with a IVB or VIB dopant element. The improvement comprises introducing into the crucible before the IVB or VIB dopant element melts, a metal having a lower melting temperature than that of the IVB or VIB dopant and a lower free energy of oxide formation than that of the IVB or VIB dopant element. While not wishing to be bound by theory, it is believed that a metal oxide is formed between the water in the boric oxide and the metal added to the crucible charge, and this occurs preferentially to that of oxide formation with the dopant element. Hence, there is an increase of dopant available during crystal growth, resulting in an increase of dopant in the final semiconductor crystal. Regardless of the mechanism by which this invention functions, the metal chosen h a lower melting temperature and a lower free energy of oxide formation than the IVB or VIB dopant element.

Since there are at least four different "metals" or "elements" employed in the same operation, it is desirable for purposes of clarity to utilize the terms in a consistent manner. Accordingly, hereinafter "dopant" or "dopant element" is used to identify the element or metal which is introduced into the semiconductor in order to increase its conductivity; the elements or metals constituting the semiconductor itself, notably IIIB and VB elements, are referred to as "semiconductor material" or "semiconductor crystal"; and the additional component which is introduced into the crucible in order to achieve the improvements provided by this invention is referred to as "metal" or "metals". In this connection, boron is considered herein as one of the "metals" even though from the technical standpoint it may be considered a non-metal. In addition, since there is a variability in periodic tables the group designations used herein are as follows:

Group IIIB: B, Al, Ga, In,
Group IVB: Si, Ge, Sn, Pb,
Group VB: P, As, Sb, Bi,
Group VIB: S, Se, Te.

Metals which may be introduced into the boric oxide in the process of this invention include boron, aluminum, chromium, indium, vanadium, cerium, neptunium, niobium, praseodymium, samarium, uranium, scandium, yttrium, and zirconium. When the dopant is silicon, metals preferably used in the process of this invention are boron, aluminum, or indium, and most preferably aluminum.

While the sequence of introduction of the metal to the crucible during the crystal growth procedure is not critical, the metal should be added at a point before the dopant element melts. This means that the metal can be admixed in the crucible with the boric oxide, or with the pre-synthesized semiconductor material before adding the boric oxide, or with the dopant or with any two or more mixtures of the foregoing. The metal can also be admixed with any one or more of the materials mentioned above before introduction of those materials into the crucible. Likewise, the metal can be added after all other materials are in the crucible as long as it is added before the dopant element melts. In a preferred embodiment of the invention, the metal is added to the crucible along with the polycrystalline semiconductor material and a IVB dopant or a VIB dopant, and the entire mixture is covered with boric oxide encapsulate. In another preferred embodiment of the invention, the metal added is also one that will melt at a temperature lower than that of the semiconductor material.

The amount of metal added is not critical to the process as long as enough is added to react with essentially all of the water present in the boric oxide so that little or no IVB or VIB oxide is formed. While this establishes the minimum amount of metal added, the maximum amount of metal used is controlled by the desired purity of the final semiconductor crystal. Hence, the ratio of metal added per charge of semiconductor material is about 0.1 to 1 gram of metal per 4 Kg of semiconductor material. Typically, a stoichiometric amount of the metal is added to react with essentially all of the water present in the boric oxide. Hence the amount of metal added will vary depending on the water content of the boric oxide. When the boric oxide contains about 200 ppm water, about 1 mg of metal per 5 grams of boric oxide is typically added. When the boric oxide contains about 900 ppm water, about 1 mg of metal per 1 gram of boric oxide is typically added.

The process of this invention can be used in the growth of a variety of semiconductor crystals including binary, ternary, and quaternary semiconductor crystals, such as GaAs, GaSb, InP, InSb, InAs, AlAs, $Ga_{1-x}Al_xAs$, $Ga_{1-x}In_xAs$, $Al_{1-x}In_xAs$, $Ga_{1-x}In_xP$, $GaAs_xP_{1-x}$ $InAs_xSb_{1-x}$, $Ga_{1-x}In_xAs_yP_{1-y}$ and the like which are doped to increase conductivity. In the foregoing formulas, x y are whole or fractional numbers from and including 0 up to and including 1. While this invention is not limited to the aforementioned semiconductor materials, it is preferable to use this process to produce highly conductive semiconductor crystals, (i.e. doped semiconductor crystals). Of the doped semiconductor crystals, the IIIB-VB semiconductor crystals are the more preferred including gallium phosphide, indium phosphide, and gallium arsenide.

Dopant elements employed in making doped semiconductor crystals include sulfur, selenium, tellurium, silicon, and germanium. Most preferably the process of this invention is used in the silicon doping of gallium arsenide semiconductor crystals in order to produce highly conductive gallium arsenide crystals (i.e. carrier concentrations greater than $2 \times 10^{17}$ per cubic centimeter).

The process of this invention is not sensitive to pressure variations in the LEC crystal growing technique. This invention can be carried out at all pressures from subatmospheric to superatmospheric. However, operation at extremely low or highly elevated pressures is costly and thus less desirable. In the most preferred embodiment of the invention, crystal growth is conducted at a pressure of 3 atmospheres by pressurizing the chamber with argon.

By way of illustration of the process of this invention, a typical procedure for growing highly conductive silicon doped gallium arsenide semiconductor crystals by the LEC technique is described below. By highly conductive crystals is meant crystals with carrier concentrations greater than $2 \times 10^{17}$ per cubic centimeter. The semiconductor crystal charge comprising a pre-synthesized IIIB-VB polycrystalline semiconductor material, the dopant, the metal, and the boric oxide are placed in the LEC crucible chamber. It is most preferable to add the boric oxide after the other components are in the crucible.

DESCRIPTION OF THE PREFERRED EMBODIMENTS

In the following examples, the IIIB-VB polycrystalline material is gallium arsenide. It is preferable to have a slight excess of arsenic in the pre-synthesized polycrystalline gallium arsenide material. By slight excess is meant that the polycrystalline material is about 52% by weight arsenic and about 48% by weight gallium.

When synthesizing the highly conductive gallium arsenide semiconductor crystals, the dopant used is preferably silicon. Aluminum is therefore the most preferred metal to use for this process because, as compared to silicon, it has a lower free energy of oxide formation and lower melting temperature.

In another preferred embodiment of the invention the melting temperature of the silicon dopant is adjusted by contacting the silicon with molten gallium. It has been discovered that by lowering the melting temperature of the silicon one can obtain better mixing of the dopant and the polycrystalline gallium arsenide material during crystal growth. It is preferable to lower the silicon melting temperature to below the melting temperature of the gallium arsenide. Most preferably, by using a binary mixture of gallium and silicon, the silicon melting temperature can be lowered to a range of about 1000° to 1150° C. The ratio of silicon to gallium in the binary mixture used as the dopant is about 1 to 9, and most preferably about 1 to 4 on a weight percent basis. The binary dopant mixture can be synthesized in situ or pre-synthesized prior to adding to the crucible. In the most preferred embodiment of the invention the binary dopant mixture is pre-synthesized prior to adding the binary mixture to the crucible. The pre-synthesized process is recommended for more precise control and better quality of the binary mixture. Hence a typical crucible charge would contain 4 kg of pre-synthesized polycrystalline gallium arsenide, 160 mg of silicon, 640 mg of gallium 400 mg of aluminum, and 600 g of boric oxide.

In conducting the experiments designated as Examples 1-11, use was made of standard LEC crystal pulling equipment. The standard equipment which is used in this process is comprised of a crucible made of quartz, pyrolytic boron nitride, aluminum nitride, silicon nitride, carbon or graphite, or the like. For maintaining purity of the final semiconductor crystal, a quartz crucible is the most preferred.

While growing the doped semiconductor crystal, a counter-clockwise rotation of the crucible versus the seed crystal is maintained. The crucible rotational speed is 18 rpm and the seed rotational speed is 6 rpm. Pulling speed of the seed is 0.32 inch per hour and the crucible is moved in the same direction as the seed is being pulled and at a rate of 0.1 inch per hour. No liquid is added to the crucible during the pulling cycle. During crystal pulling, a pressure of 3 atmospheres of argon is maintained on the crucible contents. Use is also made of a pre-synthesized binary dopant mixture of gallium and silicon, wherein the silicon is about 20 wt % of the total binary dopant mixture, the balance being about 80 wt % gallium. The pre-synthesized gallium arsenide semiconductor crystal charge is 4 kg. The entire crucible charge is then covered with 600 g of boric oxide.

The following Table illustrates the results of the use of various dopant levels of silicon and the use of different amounts of aluminum on the resultant carrier concentrations of the doped gallium arsenide semiconductor crystals.

TABLE

| Example | Dopant Silicon (mg) | Metal Al (mg) | Seed Carrier Concentration ($\times 10^{17}/cm^3$) | Seed Mobility ($cm^2$/V-sec) | Seed EPD* (#/$cm^2$) | Tail Carrier Concentration ($\times 10^{17}/cm^3$) | Tail Mobility ($cm^2$/V-sec) | Tail EPD* (#/$cm^2$) |
|---|---|---|---|---|---|---|---|---|
| 1 | 150 | — | 2.2 | 3200 | 69 | 2.6 | 3100 | 73 |
| 2 | 150 | — | 0.8 | 4100 | 62 | 1.0 | 3600 | 85 |
| 3 | 150 | 400 | 2.4 | 3400 | 64 | 2.4 | 3400 | 76 |
| 4 | 160 | 400 | 3.9 | 2900 | — | 6.6 | 2300 | — |
| 5 | 140 | 400 | 3.1 | 3200 | — | 6.9 | 2400 | — |
| 6 | 140 | — | 1.7 | 3700 | 28 | 1.5 | 3800 | 31 |

TABLE-continued

| | Dopant Silicon (mg) | Metal Al (mg) | Seed | | | Tail | | |
|---|---|---|---|---|---|---|---|---|
| Example | | | Carrier Concentration ($\times 10^{17}/cm^3$) | Mobility ($cm^2$/V-sec) | EPD* (#/$cm^2$) | Carrier Concentration ($\times 10^{17}/cm^3$) | Mobility ($cm^2$/V-sec) | EPD* (#/$cm^2$) |
| 7 | 160 | — | 2.5 | 3300 | 34 | 2.3 | 3300 | 15 |
| 8 | 160 | 800 | 2.0 | 3700 | — | 4.8 | 2700 | 27 |
| 9 | 140 | 800 | 9.5 | 2200 | 62 | 23.6 | 1500 | 46 |
| 10 | 150 | 800 | 3.4 | 3100 | 57 | 7.7 | 2300 | 20 |
| 11 | 150 | 800 | 8.3 | 2400 | 43 | 17.5 | 1800 | 14 |

*EPD = Etched Pit density

Suitability of any given metal in improving the doping of any IIIB-VB semiconductor crystal can be determined by a few simple experiments conducted in the manner disclosed herein. It must be recognized however, that conditions used in the process of this invention are susceptible to considerable variation as shown by the Table. It is also possible to vary other aspects of the above described invention without departing from the true spirit and scope thereof.

We claim:

1. A method of forming a doped crystalline body of a group III-V compound semiconductor material, comprising the steps of:
   (a) providing a container;
   (b) placing in said container each of a group III-V compound semiconductor material, boric oxide a dopant taken from one of group IVB and VIB and a metal having a lower melting temperature than the dopant;
   causing said metal to melt in said container prior to melting of said dopant;
   (d) causing said boric oxide, said dopant and said semiconductor material to melt in said container; and
   (e) pulling a crystal from the melting mixture in said container.

2. The method of claim 1 wherein said group III-V material is gallium arsenide.

3. The method of claim 1 wherein said dopant is silicon.

4. The method of claim 2 wherein said dopant is silicon.

5. The method of claim 1 wherein said metal is aluminum, boron or indium.

6. The method of claim 2 wherein said metal is aluminum, boron or indium.

7. The method of claim 3 wherein said metal is aluminum, boron or indium.

8. The method of claim 4 wherein said metal is aluminum, boron or indium.

9. The method of claim 1 wherein the ratio by weight of said metal to said boric oxide is about 1:1500, the ratio by weight of said metal to said semiconductor material is from about 1:40,000 to about 1:4,000.

10. The method of claim 2 wherein the ratio by weight of said metal to said boric oxide is about 1:1500, the ratio by weight of said metal to said semiconductor material is from about 1:40,000 to about 1:4,000.

11. The method of claim 3 wherein the ratio by weight of said metal to said boric oxide is about 1:1500, the ratio by weight of said metal to said semiconductor material is from about 1:40,000 to about 1:4,000.

12. The method of claim 4 wherein the ratio by weight of said metal to said boric oxide is about 1:1500, the ratio of weight of said metal to said semiconductor material is from about 1:40,000 to about 1:4,000.

13. The method of claim 5 wherein the ratio by weight of said metal to said boric oxide is about 1:1500, the ratio by weight of said metal to said semiconductor material is from about 1:40,000 to about 1:4,000.

14. The method of claim 6 wherein the ratio by weight of said metal to said boric oxide is about 1:1500, the ratio by weight of said metal to said semiconductor material is from about 1:40,000 to about 1:4,000.

15. The method of claim 7 wherein the ratio by weight of said metal to said boric oxide is about 1:1500, the ratio by weight of said metal to said semiconductor material is from about 1:40,000 to about 1:4,000.

16. The method of claim 8 wherein the ratio by weight of said metal to said boric oxide is about 1:1500, the ratio by weight of said metal to said semiconductor material is from about 1:40,000 to about 1:4,000.

* * * * *